(12) United States Patent
McCordic

(10) Patent No.: US 6,378,311 B1
(45) Date of Patent: Apr. 30, 2002

(54) THERMOELECTRIC DEHUMIDIFIER

(75) Inventor: Craig H. McCordic, Medfield, MA (US)

(73) Assignee: Raytheon Company, Lexington, MA (US)

( * ) Notice: Subject to any disclaimer, the term of this patent is extended or adjusted under 35 U.S.C. 154(b) by 0 days.

(21) Appl. No.: 09/574,107

(22) Filed: May 18, 2000

(51) Int. Cl.[7] .................................................. F25B 21/02
(52) U.S. Cl. .............................................. 62/3.4; 62/93
(58) Field of Search ....................................... 62/3.4, 93

(56) References Cited

U.S. PATENT DOCUMENTS

| | | | |
|---|---|---|---|
| 3,412,566 A | | 11/1968 | Townsend et al. |
| 4,400,948 A | * | 8/1983 | Moorehead ........................ 62/3 |
| 4,586,342 A | * | 5/1986 | Morishita et al. ................. 62/3 |
| 4,922,721 A | * | 5/1990 | Robertson et al. ............ 62/3.61 |
| 5,111,359 A | | 5/1992 | Montesano |
| 5,255,738 A | | 10/1993 | Przilas |
| 5,375,421 A | * | 12/1994 | Hseih .............................. 62/3.4 |
| 5,444,984 A | * | 8/1995 | Carson ........................... 62/3.4 |
| 5,448,891 A | * | 9/1995 | Nakagiri et al. ................ 62/3.4 |
| 5,555,732 A | * | 9/1996 | Whiticar ......................... 62/3.4 |
| 5,575,835 A | * | 11/1996 | Bailey et al. ...................... 96/7 |
| 5,827,424 A | | 10/1998 | Gillis et al. |
| 5,841,064 A | | 11/1998 | Mackawa et al. |
| 5,884,486 A | * | 3/1999 | Hughes et al. ................. 62/3.4 |
| 5,921,088 A | * | 7/1999 | Imaizumi et al. .............. 62/3.4 |
| 6,101,815 A | * | 8/2000 | van Oort et al. ............... 62/3.4 |
| 6,158,224 A | * | 12/2000 | Hu et al. ........................ 62/3.4 |
| 6,182,453 B1 | * | 2/2001 | Forsberg ....................... 62/125 |

FOREIGN PATENT DOCUMENTS

| | | |
|---|---|---|
| DE | 19600470 A1 | 2/1997 |
| JP | 02187120 | 7/1990 |

* cited by examiner

*Primary Examiner*—William Doerrler
*Assistant Examiner*—Mark S. Shulman
(74) *Attorney, Agent, or Firm*—Daly, Crowley & Mofford, LLP

(57) ABSTRACT

A thermoelectric dehumidifier includes at least one thermoelectric chiller element disposed within a sealed cavity defined between hot and cold plates for removing moisture from an enclosure. The thermoelectric dehumidifier can include a gutter for receiving condensate from the coldplate surface. A drainage mechanism can be coupled to the gutter for removing the collected condensate from the enclosure. An antenna array enclosure can include a thermoelectric dehumidifier that passively reduces the relative humidity within the array enclosure.

19 Claims, 5 Drawing Sheets

THERMOELECTRIC DEHUMIDIFIER

CROSS REFERENCE TO RELATED APPLICATIONS

Not Applicable.

STATEMENT REGARDING FEDERALLY SPONSORED RESEARCH

Not Applicable.

FIELD OF THE INVENTION

The present invention relates generally to dehumidifiers, and more particularly, to devices for reducing the relative humidity in enclosures.

BACKGROUND OF THE INVENTION

Challenges associated with maintaining relatively low moisture levels within enclosures containing electronic assemblies are well known to one of ordinary skill in the art. For example, it is known that condensation within a sealed unit containing electronic components accelerates corrosion of the components. Harsh environmental conditions, e.g., relatively large temperature swings, salty air, and airborne contaminants, can accelerate corrosion effects.

Various attempts have been made to decrease the moisture levels within sealed electronic enclosures. In some cases air conditioning is used to reduce humidity. However, air conditioning is relatively heavy, costly, noisy and unreliable. Desiccants placed in a sealed enclosure may have some initial success in reducing moisture levels, but will inevitably become saturated and, therefore, ineffective. Other attempts include the use of blower fans and temperature controllers. While heating the air within the enclosure may lessen the relative humidity, moisture within the air is not removed. In addition, fans are mechanically and electrically noisy which can degrade the performance of the electronics within the enclosure. Further, temperature controllers have a limited useful life since they contain active components.

It would, therefore, be desirable to provide a relatively quiet and reliable dehumidifier that removes moisture from the air within a sealed electronic enclosure.

SUMMARY OF THE INVENTION

The present invention provides a thermoelectric dehumidifier that passively reduces the relative humidity of the air within a sealed electronic assembly. While the thermoelectric dehumidifier is primarily shown and described in conjunction with an antenna array enclosure, it is understood that the invention is also applicable to other enclosures in which it is desirable to reduce the relative humidity, such as enclosures for a receiver/exciter, a high power transformer, and AC/DC power.

In one embodiment, a thermoelectric dehumidifier in accordance with the present invention includes at least one thermoelectric chiller element disposed in a sealed region defined by opposing walls. The opposing walls can correspond to a hot plate facing an interior of an enclosure in which the thermoelectric dehumidifier is located and to a coldplate facing an exterior of the enclosure. The thermoelectric dehumidifier device can include a gutter at a bottom of the coldplate for collecting condensate on the coldplate.

In operation, the thermoelectric chiller elements are energized with a direct current signal that is effective to cool the coldplate to a predetermined temperature. Moisture in the air within the relatively sealed enclosure condenses on the coldplate and travels to the gutter. The collected moisture ultimately drains to an exterior of the enclosure to reduce the relative humidity within the enclosure.

An antenna array in accordance with the present invention can include a thermoelectric dehumidifier for extracting moisture from the array enclosure. In one embodiment, the thermoelectric dehumidifier is located proximate an enclosure wall. A drainage tube extends from a gutter for draining condensate from the array interior. The thermoelectric dehumidifier reduces the relative humidity within the array enclosure.

BRIEF DESCRIPTION OF THE DRAWINGS

The invention will be more fully understood from the following detailed description taken in conjunction with the accompanying drawings, in which.

DETAILED DESCRIPTION OF THE INVENTION

Figure 1:
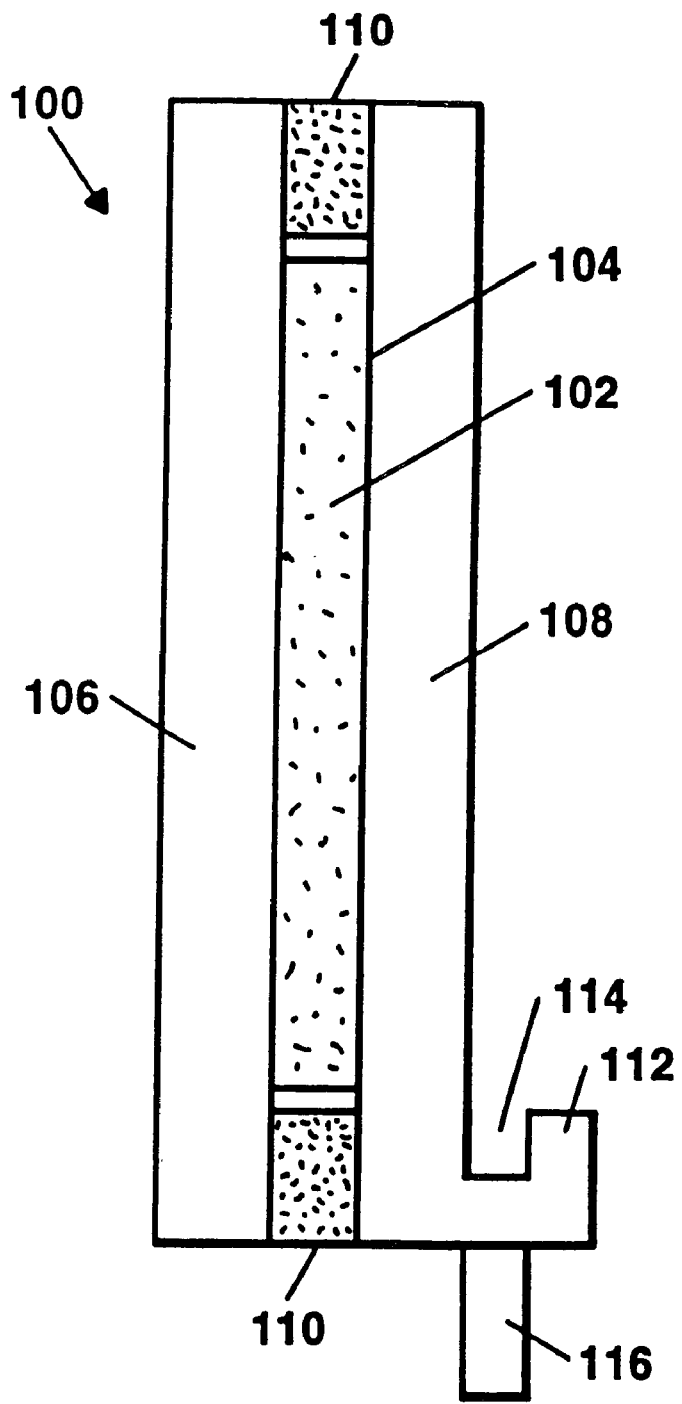
FIG. 1 is a schematic cross-sectional of a thermoelectric dehumidifier in accordance with the present invention.

FIG. 1 shows a thermoelectric dehumidifier 100 in accordance with the present invention for removing reducing moisture levels within a substantially sealed enclosure. The thermoelectric dehumidifier 100 is well suited to decreasing relative humidity levels within electronic enclosures to reduce corrosion of components within the enclosure.

In an exemplary embodiment, the thermoelectric dehumidifier 100 includes at least one thermoelectric chiller (TEC) element 102 (FIG. 2) disposed in a region 104 located between a first wall 106 and a second wall 108. In one embodiment, the first wall 106 corresponds to a hot plate facing an interior of an enclosure and the second wall corresponds to a cold plate facing an exterior of the enclosure, as described more fully below. The region 104 between the hot and cold plates 106,108 should be sealed to provide a closed environment for the thermoelectric chiller elements. In one embodiment, a sealant 110, such as silicone, is disposed at ends of the hot and coldplates to seal the region 104.

The thermoelectric dehumidifier 100 can include an optional gutter 112 for receiving condensate that collects on the cold plate 108. It is understood that gutter is to be construed broadly to include known liquid collecting structures that guide liquid to a desired location. In an exemplary embodiment, the gutter 112 includes a U-shaped channel 114 extending outwardly from the coldplate surface. A drainage mechanism 116, such as a tube or other fluid carrying device, can be connected to the gutter 112 to provide a conduit for fluid to drain from the enclosure.

Figure 1A:
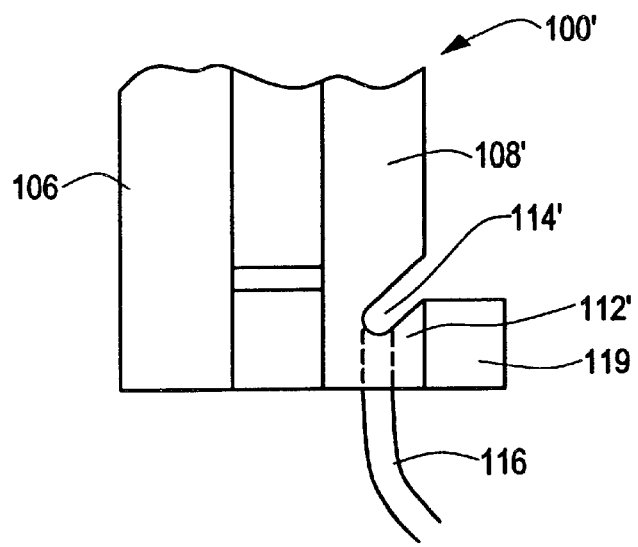
FIG. 1A is a schematic cross-sectional view of an alternative embodiment of a thermoelectric dehumidifier in accordance with the present invention.

FIG. 1A shows an alternative gutter 112' structure in which a channel 114' is formed within the coldplate 108'. A thermally insulative material 119 can be affixed to the coldplate in a region below the channel 114' to inhibit the formation of condensate at locations in which the condensate will not flow into the gutter 112', as described more fully below.

Figure 2:
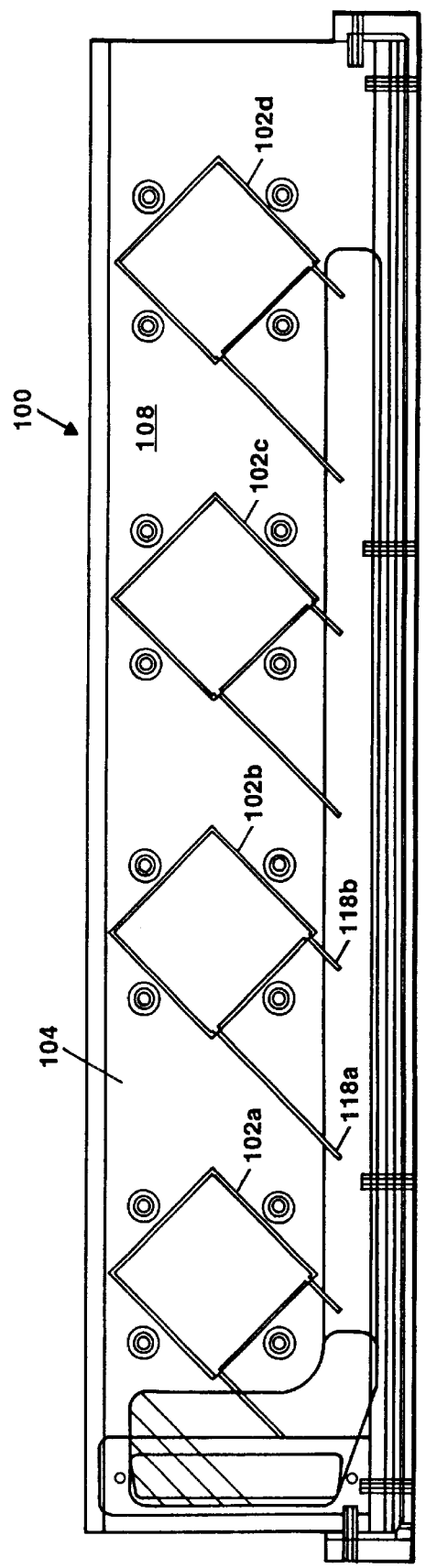
FIG. 2 is a lengthwise cutaway view of a thermoelectric dehumidifier in accordance with the present invention.

FIG. 2 shows the interior region 104 of the thermoelectric dehumidifier 100 of FIG. 1 with the hot plate 106 removed. The thermoelectric dehumidifier 100 includes four TEC elements 102a–d coupled in series along the length of the cold plate 108. The TEC elements 102 transfer heat from the cold plate to the hot plate when energized. It is understood that the number of TEC elements can vary in accordance with the requirements of a particular application. It is further understood that TEC elements can also be coupled in parallel. Each of the TEC elements 102 is energized with DC signal energy via first 118a, e.g., positive, and second 118b, e.g., ground, connections. The TEC elements can be provided as part number CP1.4–054L from Melcor corporation of Trenton, N.J. having a website identified as www.melcor.com. These parts operate at about seven volts drawing about fourteen Amps.

It is understood that the spacing of the TEC elements can vary to meet the requirements of a particular application. In general, the TEC element spacing should minimize temperature gradients between TEC elements.

Figure 3:
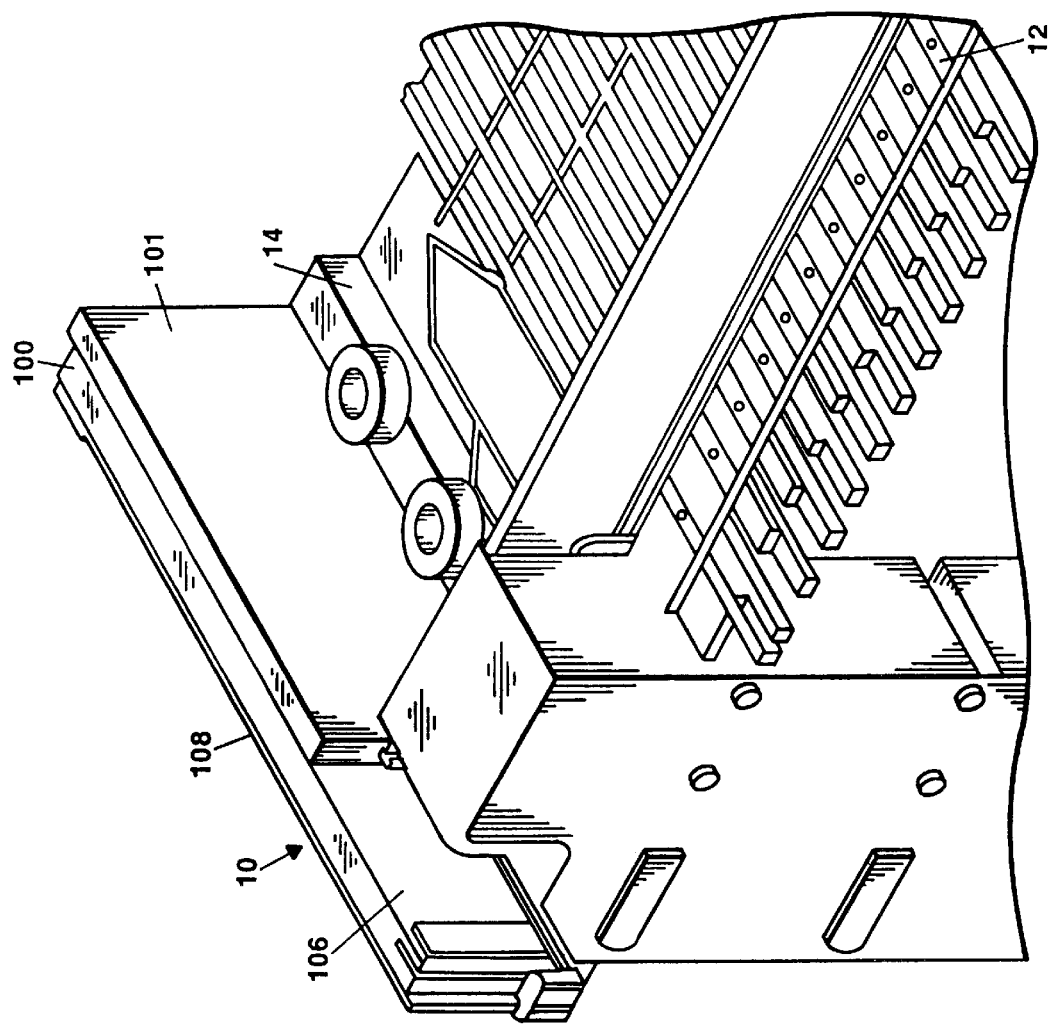
FIG. 3 is a perspective view of a thermoelectric dehumidifier in accordance with the present invention shown within an enclosure.

FIG. 3 shows a portion of an exemplary enclosure 10 having a thermoelectric dehumidifier 100 in accordance with the present invention. The enclosure can be an antenna array for a shipboard radar that may include thousands of transmit/receive modules (not shown). The array 10 includes a support structure 12 for holding the transmit/receive modules. The support structure 12 can include a manifold 14 having a fluid coolant network for dissipating heat and maintaining the temperature within the enclosure to acceptable levels. First and second fluid ports 16 can form a part of the coolant network that can extend throughout the support structure.

The thermoelectric dehumidifier 100 can be located in a variety of locations within the array enclosure. In an exemplary embodiment, the thermoelectric dehumidifier 100 is located in upper corner of the array enclosure 10 to take advantage of natural convection within the enclosure. The hotplate 106 can face the transmit receive modules and the coldplate 108 can face an outer wall of the array enclosure. A stiffening member 109 can be affixed to the hotplate 106 to increase the overall structural integrity of the dehumidifier. A gap ranging from about one inch to about six inches is provided between the coldplate and the enclosure to allow natural convection to circulate air within the enclosure. That is, air within the relatively sealed enclosure circulates without active forces, such as a fan. Mass diffusion reduces humidity in the absence of air circulation but at a relatively slow rate.

Figure 4:
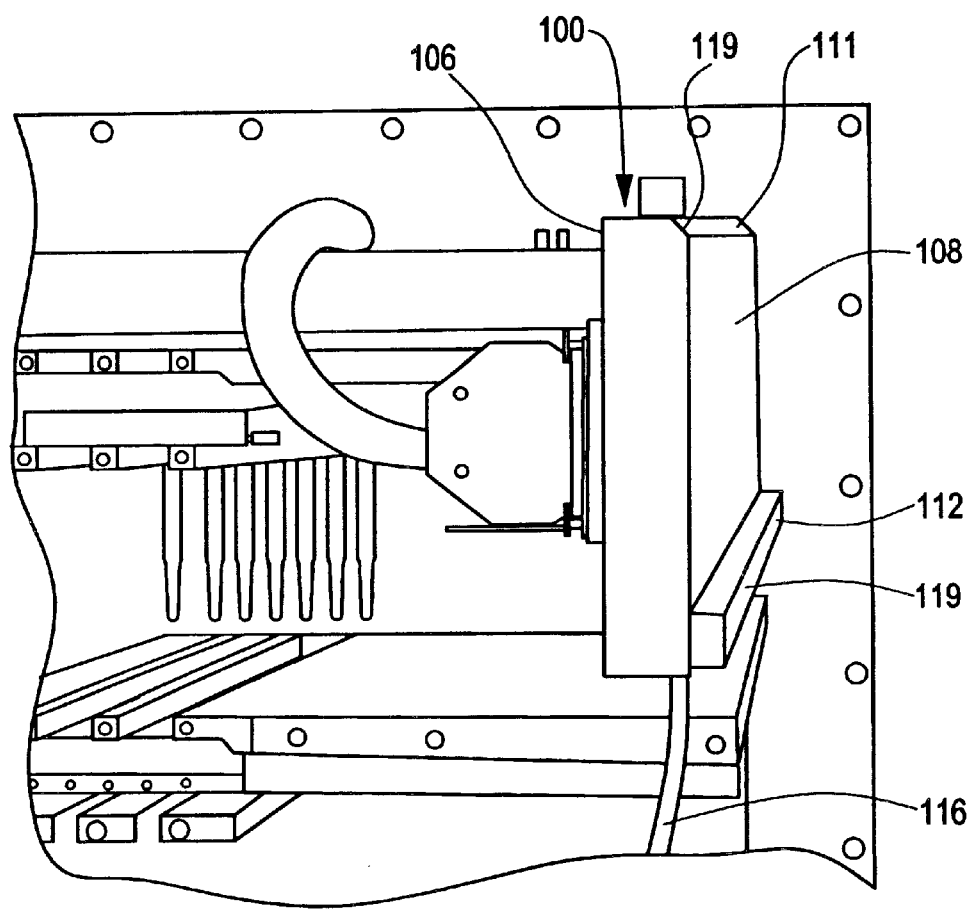
FIG. 4 is a further perspective view of the thermoelectric dehumidifier of FIG. 3 within an antenna array enclosure.

FIG. 4 shows a further embodiment of an antenna array having a thermoelectric dehumidifier 100 in accordance with the present invention. One or more corners of the thermoelectric dehumidifier 100 proximate the coldplate 108 can be formed as a beveled surface 111 to facilitate condensate collection on the coldplate and into the gutter 112 at the bottom of the device. In addition, portions of the coldplate 108 in which it is undesirable to form condensate can be covered with a thermally insulative material 119. In general, insulation is affixed to the thermoelectric dehumidifier at edges of the outer surface on or near the coldplate as well as below the gutter since condensate formed below the gutter would not drain into the gutter.

In operation, the coldplate 108 is cooled to a relatively cold temperature, e.g., four degrees Celsius, which causes moisture in the enclosure to condense on the coldplate. The moisture collects on the coldplate 108 and travels downward into the gutter 112 and ultimately out of the enclosure via the drainage tube 116. In the event that external air enters the enclosure via the drainage tube, this air is immediately exposed to the coldplate. Thus, moisture within incoming air is at least to some extent removed before it enters the array interior.

It is understood that the overall dimensions of the thermoelectric dehumidifier of the present invention will vary in accordance with the intended application. In one exemplary embodiment, an antenna array includes thousands of transmit/receive modules contained within a 6 by 4 by 1.5 foot array enclosure. An exemplary thermoelectric dehumidifier in accordance with the present invention can include four thermoelectric chiller elements each being about 1.5 inch by 1.5 inch. The dehumidifier can have a length of about 16 inches, a height of about three inches and a width of about one inch.

Figure 5:
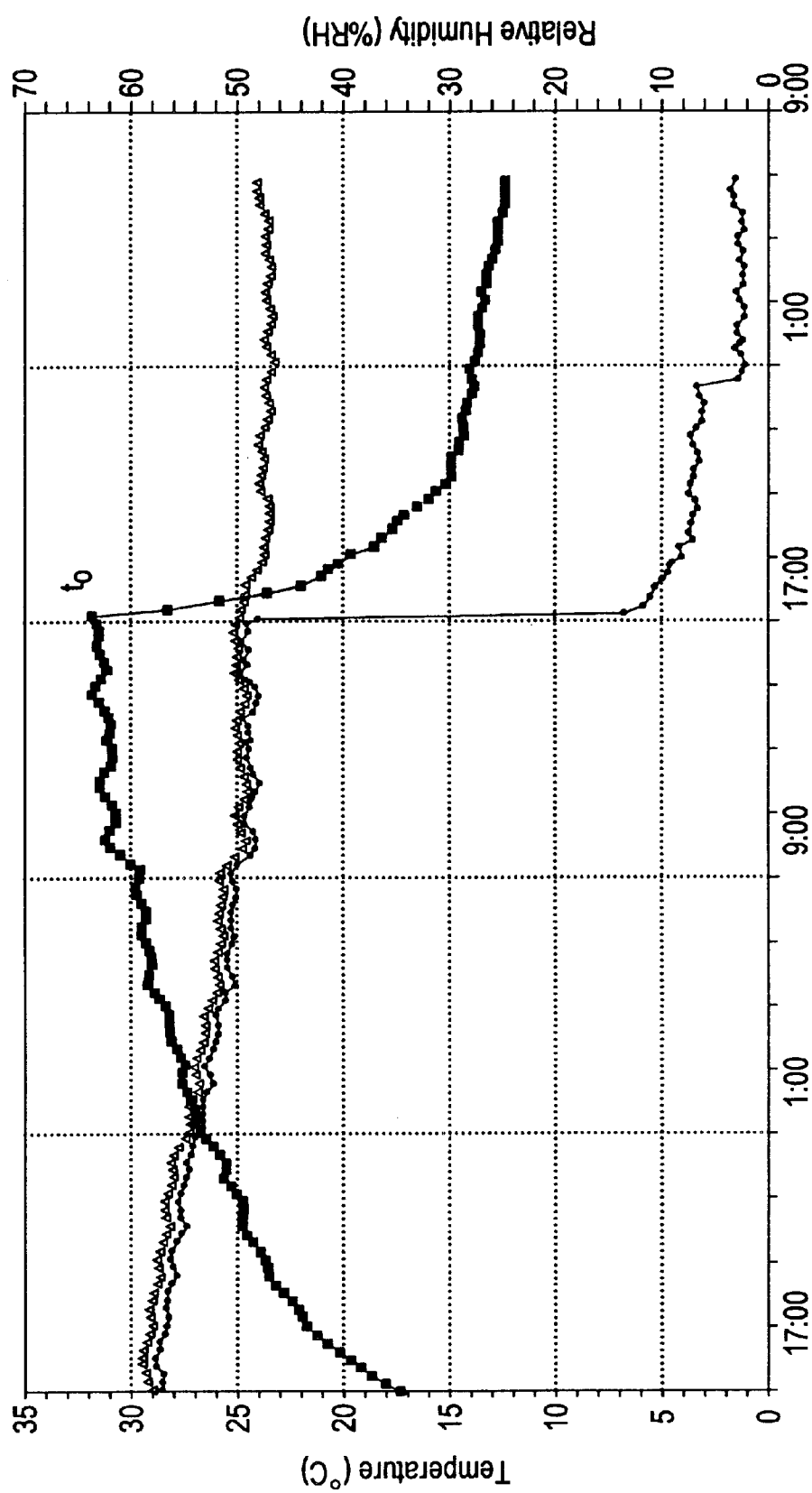
FIG. 5 is a graphical depiction of relative humidity over time in an exemplary electronic enclosure before and after activation of a thermoelectric dehumidifier in accordance with the present invention.

FIG. 5 shows the relatively humidity over time for an exemplary enclosure that is about five feet wide, six feet high and about one and one half feet deep and contains about five thousand transmit/receive modules. The operating temperature within the array is about twenty-eight degrees Celsius and the thermoelectric dehumidifier is located in an upper corner of the array, as shown in FIG. 4.

When the thermoelectric dehumidifier is activated at time $t_0$ (17:00 hours), the relative humidity in the array enclosure decreases from about sixty-five percent to about thirty percent in about four hours. The coldplate temperature of the thermoelectric dehumidifier decreases to a steady state temperature of about three or four degrees Celsius.

Similar device performance is achieved for comparable ratios of coldplate surface area and air volume. The rate at which moisture is removed from an enclosure depends in part upon the surface area of the coldplate and the volume of air within the enclosure.

It is understood that the temperature to which the coldplate is cooled can vary. An exemplary temperature range for the coldplate is from about two to about twenty degrees Celsius. In one embodiment, the coldplate temperature is held to about three degrees Celsius. The hotplate has a temperature ranging from about twenty-five degrees Celsius to about fifty-five degrees Celsius. It is understood that the coldplate temperature defines the dew point within the enclosure, which can be selected based upon size of the TEC elements in conjunction with thermal analysis of the enclosure operating condition.

The hotplate and coldplate of the thermoelectric dehumidifier can be formed from a variety of suitable materials known to one of ordinary skill in the art. In general, the hot and coldplates should be relatively heat transmissive and rigid. It is understood that many metals, such as aluminum, as well as plastics and ceramics having suitable properties can be used. In one embodiment, the hotplate and the coldplate are formed from aluminum.

The thermoelectric chiller elements can be selected from a variety of suitable Peltier-type devices that move heat from one side of a device to the other when a DC current is applied. An exemplary device includes two ceramic plates having an array of Bismuth Telluride cubes therebetween.

It is understood that one of ordinary skill in the art can readily stack thermoelectric elements in series and/or parallel to achieve a desired heat transfer capacity.

The thermoelectric dehumidifier of the present invention is effective to passively reduce the relative humidity of an enclosure. The passive nature of the thermoelectric chiller elements minimizes electrical and mechanical noise. In addition, the thermoelectric dehumidifier gracefully degrades in performance in the event one or more the thermoelectric chiller elements fails. Further, the placement of the dehumidifier can be selected to reduce the moisture contained incoming air prior to dispersion within the array enclosure. The thermoelectric dehumidifier is relatively low power and is relatively reliable as compared to dehumidifier devices having moving parts.

One of ordinary skill in the art will appreciate further features and advantages of the invention based on the above-described embodiments. Accordingly, the invention is not to be limited by what has been particularly shown and described, except as indicated by the appended claims. All publications and references cited herein are expressly incorporated herein by reference in their entirety.

What is claimed is:

1. A system including a substantially sealed enclosure having passive moisture reduction, comprising:
    a thermoelectric dehumidifier having a first thermoelectric chiller element disposed between a hotplate and a coldplate; and
    a support structure for supporting the thermoelectric dehumidifier and a plurality of electronic modules within the substantially sealed enclosure, the support structure including a liquid coolant network,
    wherein the thermoelectric dehumidifier passively reduces moisture levels and the support structure actively dissipates heat within the substantially sealed enclosure.

2. The system according to claim 1, wherein the thermoelectric dehumidifier is located in a corner of the enclosure such that the coldplate faces an exterior of the enclosure.

3. The system according to claim 2, wherein the hotplate faces an interior of the enclosure.

4. The system according to claim 1, wherein the first thermoelectric chiller element is disposed within a sealed chamber.

5. The system according to claim 1, further including a thermally insulative material disposed on a portion of an exterior surface of the thermoelectric dehumidifier for preventing condensation on the covered portion of the thermoelectric dehumidifier.

6. The system according to claim 1, wherein the thermoelectric dehumidifier includes a beveled exterior portion.

7. The system according to claim 1, further including additional thermoelectric chiller elements coupled to the first thermoelectric chiller element in parallel.

8. The system according to claim 1, further including additional thermoelectric chiller elements coupled to the first thermoelectric chiller element in series.

9. The system according to claim 1, wherein the coldplate is adjacent an interior wall of the enclosure.

10. The system according to claim 1, further including a gutter formed on the thermoelectric dehumidifier for collecting condensate formed on the coldplate.

11. The system according to claim 1, further include a draining mechanism for draining condensate from the coldplate.

12. The system according to claim 1, wherein the enclosure corresponds to an antenna array.

13. A method for reducing moisture levels in a substantially sealed enclosure, comprising:
    placing a thermoelectric dehumidifier having a thermoelectric chiller element disposed between a hot plate and a cold plate inside the substantially sealed enclosure;
    securing the thermoelectric dehumidifier and a plurality of electronic modules to a support structure having a liquid coolant network for actively dissipating heat; and
    passively reducing moisture levels within the substantially sealed enclosure by activating the thermoelectric dehumidifier.

14. The method according to claim 13, further including locating the thermoelectric dehumidifier in a corner of the enclosure.

15. The method according to claim 14, further including facing the hot plate towards the electronic modules.

16. The method according to claim 15, further including placing the cold plate adjacent an interior wall of the enclosure.

17. The method according to claim 13, further including sealing the thermoelectric chiller element within a chamber.

18. The method according to claim 13, further including covering a portion of an exterior of the thermoelectric dehumidifier with a thermally insulative material.

19. The method according to claim 13, further including draining condensate formed on the coldplate from the enclosure.

* * * * *

UNITED STATES PATENT AND TRADEMARK OFFICE
CERTIFICATE OF CORRECTION

PATENT NO.    : 6,378,311 B1
DATED         : April 30, 2002
INVENTOR(S)   : McCordic It is certified that error appears in the above-identified patent and that said Letters Patent is hereby corrected as shown below:

<u>Column 4,</u>
Line 29, delete "comer" and replace with -- corner --.

Signed and Sealed this

Second Day of July, 2002

*Attest:*

JAMES E. ROGAN
*Director of the United States Patent and Trademark Office*

*Attesting Officer*